United States Patent
Rowell et al.

(10) Patent No.: US 11,709,191 B1
(45) Date of Patent: Jul. 25, 2023

(54) COMPACT ANTENNA TEST RANGE SYSTEM AND METHOD FOR CALIBRATING A COMPACT ANTENNA TEST RANGE

(71) Applicant: Rohde & Schwarz GmbH & Co. KG, Munich (DE)

(72) Inventors: Corbett Rowell, Prien am Chiemsee (DE); Mert Celik, Munich (DE); Anes Belkacem, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/733,092

(22) Filed: Apr. 29, 2022

(51) Int. Cl.
  *G01R 31/302* (2006.01)
  *G01R 29/08* (2006.01)
  *H01Q 15/14* (2006.01)
  *G01R 29/10* (2006.01)

(52) U.S. Cl.
  CPC ....... *G01R 29/0871* (2013.01); *G01R 29/105* (2013.01); *H01Q 15/14* (2013.01)

(58) Field of Classification Search
  CPC .. G01R 29/10; G01R 29/105; G01R 29/0814; G01R 29/0821; G01R 29/0878; G01R 29/0892; G01R 29/0871; G01R 31/001; G01R 1/0018; H01Q 15/14
  See application file for complete search history.

(56) References Cited

U.S. PATENT DOCUMENTS

| | | | |
|---|---|---|---|
| 10,746,775 B1 | 8/2020 | Luley | |
| 11,476,956 B2* | 10/2022 | Liu | H04B 17/16 |
| 2018/0006745 A1* | 1/2018 | Vanwiggeren | H04B 17/102 |
| 2020/0038680 A1 | 2/2020 | Degenaar et al. | |
| 2021/0148959 A1* | 5/2021 | Rowell | G01R 29/105 |
| 2022/0146627 A1* | 5/2022 | Fisch | G01S 7/497 |

FOREIGN PATENT DOCUMENTS

| | | |
|---|---|---|
| DE | 102017122443 A1 | 3/2019 |
| EP | 2730040 B1 | 10/2018 |
| EP | 3945628 A1 | 2/2022 |

OTHER PUBLICATIONS

J. R. Thorpe and J. C. Bennett, "Characterising the quiet zone of an anechoic chamber," 2004 IEE Antenna Measurements and SAR, 2004, pp. 25-28.

* cited by examiner

Primary Examiner — Thang X Le
(74) Attorney, Agent, or Firm — Ditthavong, Steiner & Mlotkowski

(57) ABSTRACT

The present disclosure relates to a compact antenna test range (CATR) system. The CATR system comprises a measurement chamber, at least one feed antenna which is configured to transmit a radio frequency, RF, signal, at least one reflector which is arranged to reflect the RF signal towards a measurement area in the measurement chamber, and at least two preferably metallic calibration surfaces which can be arranged at two or more positions in the measurement area, wherein the calibration surfaces are configured to reflect a respective reflection of the RF signal back to the at least one reflector which is, in turn, configured to reflect the reflections of the RF signal back to the at least one feed antenna. The CATR system further comprises a measurement unit which is configured to receive the respective reflections of the RF signal and to determine and/or visualize a time difference between the reception of the respective reflections of the RF signal.

17 Claims, 5 Drawing Sheets

COMPACT ANTENNA TEST RANGE SYSTEM AND METHOD FOR CALIBRATING A COMPACT ANTENNA TEST RANGE

TECHNICAL FIELD

The disclosure relates to a compact antenna test range (CATR) system and to a method for calibrating a CATR, in particular for adjusting the alignment and/or position of a parabolic reflector of the CATR.

BACKGROUND ART

It is known to use compact antenna test ranges (CATR) for testing and characterizing devices-under-test (DUT), such as test antennas. The CATR typically uses a parabolic mirror to convert a spherical wave into a plane wave which is irradiated towards the DUT. The DUT is thereby placed in the so-called quiet-zone of the CATR. In the quiet zone, the amplitude and phase uniformity of the plane wave are optimized. Thereby, the performance of the CATR, in particular the optimization of the plane wave parameters in the quiet zone, largely depends on a precise alignment of the CATR reflector.

It is known to perform an alignment of a CATR reflector by using a standard gain horn reference antenna which is placed at different locations in the quiet zone. The horn antenna is thereby used to measure the phase of an RF wave at the different locations in the quiet zone. The alignment of the CATR reflector is then adjusted until a phase difference between the different locations is minimized. However, when using a horn antenna as a reference antenna for calibrating a CATR, the mounting and aperture of the horn antenna as well as the bending of cables while moving the horn antenna to different locations can negatively affect the calibration measurements and cause uncertainty.

The document US 2020/0386800A1 discloses a system for characterizing a quiet zone of an over-the-air testing space which includes at least one measurement antenna and at least one scattering member. The measurement antenna is configured to transmit electromagnetic signals and the scattering member is enabled to scatter the electromagnetic signals so as to generate scattered electromagnetic signals that are transmitted in a defined manner. However, for analyzing purposes, the scattering properties of the scattering member need to be known and scattering from other objects in the over-the-air testing space could affect the measurement.

Furthermore, laser interferometry could also be used to measure the alignment of a CATR reflector. However, such a measurement can be time-consuming and does not provide direct feedback about the quality of the quiet zone.

SUMMARY

Thus, there is a need to provide an improved CATR system and an improved method for calibrating a CATR, which avoid the above-mentioned disadvantages.

According to a first aspect, the present disclosure relates to a compact antenna test range (CATR) system, comprising: a measurement chamber, at least one feed antenna which is configured to transmit a radio frequency (RF) signal, at least one reflector which is arranged to reflect the RF signal towards a measurement area in the measurement chamber, and at least two preferably metallic calibration surfaces which can be arranged at two or more positions in the measurement area, wherein the calibration surfaces are configured to reflect a respective reflection of the RF signal back to the at least one reflector which is, in turn, configured to reflect the reflections of the RF signal back to the at least one feed antenna. The CATR system further comprises a measurement unit which is configured to receive the respective reflections of the RF signal and to determine and/or visualize a time difference between the reception of the respective reflections of the RF signal.

This achieves the advantage that the alignment and/or position of the reflector can be assessed based on the detected time difference between the reflections of the RF signals from the calibration surfaces. For instance, the smaller the time difference, the better the alignment, respectively positioning, of the reflector and the better, i.e. more uniform, the RF signal in the measurement area.

The measurement area can be the quiet zone of the CATR system. The quiet zone is the area where a DUT, e.g. a test antenna, is typically placed during a measurement with the CATR.

The two or more positions in the measurement area can be arranged along an axis that is perpendicular to a propagation direction of the RF signal that is reflected from the at least one reflector towards the measurement area. Thus, if the CATR reflector is perfectly aligned the RF signal reaches the calibration surfaces simultaneously and, thus, also the reflection of the RF signal from the calibration surfaces is simultaneously received at the feed antenna (no time delay). However, misalignment of the reflector leads to a time difference in the reception of the reflected signals at the feed antenna.

The CATR system can be calibrated based on the determined and/or visualized time difference between the RF reflections from the respective calibration surfaces. In particular, the alignment and/or position of the reflector can be adjusted until the time difference between the RF reflections from the calibration surfaces is smaller than a threshold value. In other words, there is a first reflection from the first calibrations surface and a second reflection from the second calibration surface. If both reflections arrive at the feed antenna simultaneously or within a certain time window that is smaller than a threshold, then the CATR reflector is considered to be perfectly aligned. However, if there is a time difference between both reflections being received at the feed antenna that is larger than a threshold, then the CATR reflector has to be aligned. The time difference could be measured for example by calculating the difference between two peaks of the RF reflections. In that case, the time difference is determined. In addition or alternatively, the time difference could also be visualized. For example, the visualization could comprise a number output to the user corresponding to the time difference. The visualization could also comprise displaying different signal levels over time (of the reflected RF signals) to the user for example. The visualization could also comprise an indicator (for example two different lights (for example red light/green light) indicating whether the time difference is below the threshold or not. In general, for both determining and visualizing, the RF reflections have to be measured by the CATR system.

The time difference between the reception of the respective reflections can be measured in one continuous measurement when the calibration surfaces are simultaneously arranged in the measurement area. Alternatively, the calibration surfaces can be individually and successively arranged in the measurement area. In this case, separate measurements of the time between the transmission of the RF signal and the reception of the reflection can be performed for each of the calibration surfaces arranged in the measurement area. The time delay between the respective reflections can then be determined by comparing these separate time measurements.

The RF signal can be a signal between 6 GHz and 90 GHz, preferably between 30 GHz and 40 GHz.

The measurement unit can comprise a vector network analyzer (VNA) or a signal generator and a power meter. The measurement unit can further comprise a processor which is configured to determine and/or to visualize the time difference between the reception of the respective reflections.

In particular, the RF signal that is generated by the feed antenna is essentially a spherical wave. The reflector is preferably a parabolic reflector which is arranged to reflect the RF signal towards the measurement area and thereby convert the RF signal into essentially a plane wave signal.

In an embodiment, the measurement unit is configured to detect a signal peak for each reflection of the RF signal from one of the calibration surfaces, and the measurement unit is configured to determine the time difference between the reception of the respective reflections of the RF signal based on a temporal difference between the detected signal peaks.

For instance, a misalignment of the reflector results in a longer time difference between two peaks within the reflected signal, because a part of the signal has to travel over a longer distance. The measurement unit can be configured to analyze the reflections of the RF signal and to detect the peaks in said reflections. The measurement unit can be configured to only determine the time difference between peaks whose signal strength exceeds a threshold value or only between the two peaks with the highest signal strength.

For instance, additional smaller peaks in the received reflected signals could be caused by reflections from other objects in the measurement chamber, e.g., chamber walls, positioner, cables, etc. Such smaller peaks can be discarded by the measurement unit, e.g. if their signal strength is lower than a threshold value. Only considering the time difference between the "main peaks" (i.e., peaks caused from reflection from calibration surfaces) and discarding such secondary peaks in the reflected signals provides the advantage that secondary scattering from other objects in the measurement chamber does not negatively affect the measurement result. In particular, peaks arriving in a time window which is less than a threshold (after the RF signal has be transmitted by the feed antenna) could also be discarded. In other words, if a RF signal is reflected back too soon to the feed antenna, then it might also be discarded.

In an embodiment, the at least one reflector comprises at least two or at least three adjustment bolts, wherein an alignment and/or a position of the at least one reflector can be adjusted by means of the adjustment bolts.

For instance, a user can manually adjust the alignment and/or position of the at least one reflector with the adjustment bolts. Having three adjustment bolts, the reflector can preferably be tilted in all three directions. Further, it can be possible to translate the reflector via the three bolts. The bolts may be threated to allow a fine adjustment of the reflector tilting and/or position. For example, the bolts are fine adjustment screws tipped with ball bearings that press against a mounting plate of the reflector. The bolts can be arranged in the same plane or in different planes. Alternatively or additionally, the CATR system can comprise a calibration unit which is configured to adjust the alignment and/or position of the at least one reflector based on the detected time difference.

In an embodiment, the CATR system comprises a positioner which is arranged in the measurement chamber, wherein the positioner is made of an RF transparent material, and wherein the at least two calibration surfaces can be arranged on the positioner.

In particular, the positioner is made from a material that is at least partially transparent for the RF frequency of the RF signal. The positioner can also be used for holding a DUT during an actual over-the-air test measurements performed with the CATR system.

In an embodiment, the positioner comprises a plurality of calibration spots which are adapted for arranging and preferably fixing the respective at least two calibration surfaces. For example, the calibration spots can be recesses or can comprise recesses for inserting metallic objects that comprise the calibration surfaces. The calibration spots could also comprise protrusions that engage with respective openings on the bottom side of the metallic objects that comprise the calibration surfaces. A metallic object is also considered to be a metallic object if only the surface which forms the calibration surface is metallic. If for example, a plastic base is coated with a metallic layer, the whole structure could be the metallic object. However, the metallic object can also be solidly constructed. In that case, the metallic object could be made of metal or a metal alloy. An additional metallic coating can be applied if needed.

In an embodiment, the at least two calibration surfaces are successively arranged at different calibration spots of the positioner.

For instance, two calibration spots of the positioner can be used for simultaneously arranging the two calibration surfaces in the measurement area. Subsequently, the two calibration surfaces can be arranged at two different spots of the positioner. The first two spots can be arranged in a first plane and the second two spots can be arranged in a second plane which is perpendicular to the first plane. In this way, the alignment and/or position of the at least one reflector can be adjusted in three dimensions.

Alternatively, one calibration surface can be arranged at a first spot of the positioner, and subsequently another calibration surface can be arranged at a second spot of the positioner.

In an embodiment, the at least two calibration surfaces are conically shaped.

In an embodiment, the at least two calibration surfaces are identical.

In an embodiment, the at least two calibration surfaces are surfaces of a single metallic object. For instance, the single metallic object can be successively placed in a first and a second calibration spot of the positioner.

In particular, the metallic object comprises a curved surface and straight sides such that the object is symmetric around at least one axis. The object can further comprise a flat base for mounting on the positioner, particularly in the calibration spots of the positioner.

In an embodiment, the at least two calibration surfaces are surfaces of different metallic objects.

In an embodiment, each of the metallic objects is symmetric around at least one axis. The at least one axis can be perpendicular to a propagation direction of the RF signal that is reflected off the reflector towards the measurement area. For instance, the metallic objects can comprise a curved surface and/or straight sides.

In an embodiment, each of the metallic objects comprises a flat base. This achieves the advantage that the object can be easily mounted and preferably fixed on the positioner, particularly in the calibration spots of the positioner.

In an embodiment, the two or more positions in the measurement area are arranged in a first plane and are symmetrical to each other relative to a central axis of the measurement area. The central axis can be parallel to a propagation direction of the RF signal that is reflected off the reflector towards the measurement area.

In an embodiment, the at least two calibration surfaces can be arranged at two or more further positions in the measurement area, wherein the two or more further positions are arranged in a second plane that is perpendicular to the first plane.

Thus, the calibration surfaces can be arranged in a first plane and also in a second plane which is perpendicular to the first plane. The positioner can be adapted to allow the arrangement of the at least two calibration surfaces at the two or more further positions. E.g., the positioner can comprise calibration spots for arranging the calibration surfaces at the two or more further positions.

In an embodiment, the CATR system comprises a further reflector, wherein the further reflector is arranged between the feed antenna and the at least one reflector or between the at least one reflector and the measurement area, and/or wherein the further reflector is arranged at an angle to the at least one reflector and is configured to reflect a further RF signal from another feed antenna to the measurement area.

For instance, the measurement unit can be configured to determine and/or visualize a time difference between respective reflections from the further reflector. In this way, the alignment and/or position of the further reflector can also be adjusted.

According to a second aspect, the present disclosure relates to a method for calibrating a compact antenna test range, CATR, the method comprising the steps of:
a) arranging at least two preferably metallic calibration surfaces at two or more positions in the measurement area of the CATR,
b) transmitting an RF signal with a feed antenna,
c) reflecting the RF signal towards the measurement area with at least one reflector,
d) receiving a respective reflection of the RF signal from the calibration surfaces at each position in the measurement area,
e) determining and/or visualizing a time difference between the reception of the respective reflections of the RF signal, and
f) adjusting an alignment and/or position of the at least one reflector until the time difference is smaller than a threshold value.

The CATR can comprise the feed antenna, the at least one reflector and a measurement chamber. The measurement area can be arranged in the measurement chamber. In particular, the CATR can be a CATR system according to the first aspect of the disclosure. The calibration of the CATR may refer to the adjustment of the alignment and/or position of the at least one reflector of the CATR.

In particular, determining the time difference between the reception of the respective reflections can comprise measuring the time difference (for example in µs) between the respective reflections, e.g. by measuring a time difference between two peaks, and visualizing the time difference between the respective reflections can comprise plotting the captured signal.

The time difference between the receptions of the respective reflections of the RF signal can be visualized on a display of a measurement unit. The measurement unit can be configured to perform the steps b)-e). The measurement unit can further generate the RF signal and control the feed antenna to transmitted said signal.

In an embodiment, the two or more positions in the measurement area are arranged in a first plane, wherein the method further comprises the steps of:
g) rearranging the at least two calibration surfaces to two or more further positions in the measurement area, wherein two or more further positions are arranged in a second plane that is perpendicular to the first plane, and
h) repeating the steps b)-f) with the at least two calibration surfaces arranged in the two or more further positions.

For instance, the alignment and/or position of the at least one reflector can first be adjusted in the first plane according to steps c)-f). Subsequently, the alignment and/or position of the least one reflector can be adjusted in the second plane according to steps g)-h).

The above description with regard to the CATR system according to the first aspect of the disclosure is correspondingly valid for the method according to the second aspect of the disclosure.

BRIEF DESCRIPTION OF THE DRAWINGS

The above described aspects and implementation forms of the present disclosure will be explained in the following description of specific embodiments in relation to the enclosed drawings, in which.

DETAILED DESCRIPTIONS OF EMBODIMENTS

Figure 1:
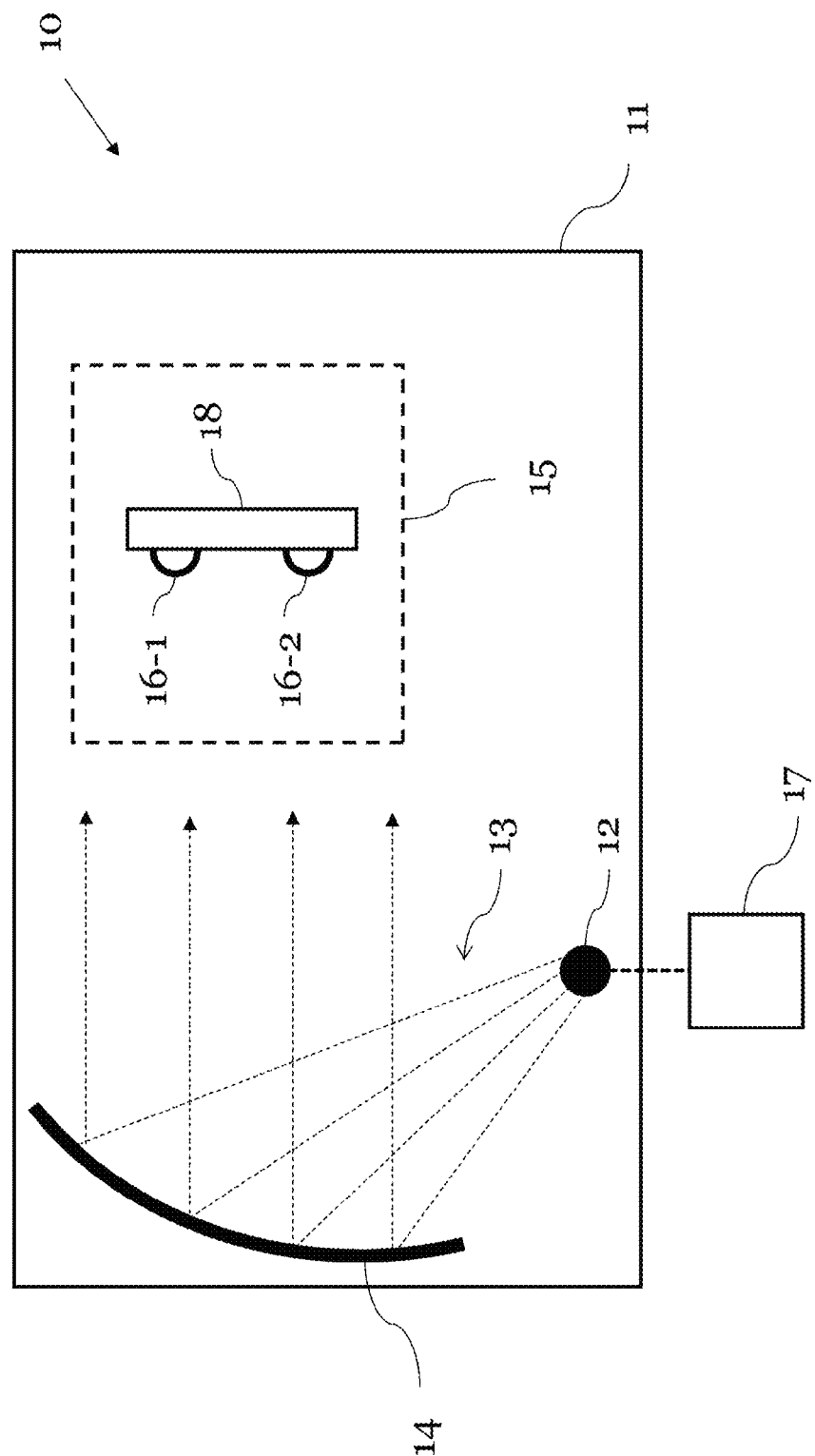
FIG. 1 shows a schematic diagram of a CATR system according to an embodiment.

FIG. 1 shows a schematic diagram of a compact antenna test range (CATR) system 10 according to an embodiment.

The CATR system 10 comprises a measurement chamber 11, at least one feed antenna 12 which is configured to transmit a radio frequency (RF) signal 13, and at least one reflector 14 which is arranged to reflect the RF signal 13 towards a measurement area 15 in the measurement chamber 11. The CATR system 10 further comprises at least two calibration surfaces 16-1, 16-2 which can be arranged at two or more positions in the measurement area 15, wherein the calibration surfaces 16-1, 16-2 at each position in the measurement area 15 are configured to reflect a respective reflection of the RF signal 13 back to the at least one reflector 14 which is, in turn, configured to reflect the reflections of the RF signal 13 back to the at least one feed antenna 12. The CATR system further comprises a measurement unit 17 which is configured to receive the respective reflections of the RF signal 13 and to determine and/or visualize a time difference between the reception of the respective reflections of the RF signal 13.

The calibration surfaces 16-1, 16-2 can be metallic calibration surfaces.

The at least one reflector 14 can be a parabolic reflector. For instance, the parabolic reflector has blended rolled edges. The feed antenna 12 can be arranged in a focal point of the reflector 14.

The measurement chamber 11 can be an anechoic chamber, in particular an RF anechoic chamber. The interior of the measurement chamber 11 can be covered with a radiation absorbent material and/or a radiation absorbent structure.

The measurement unit 17 can comprise a vector network analyzer (VNA), a signal generator and/or a power meter. The measurement unit 17 can be configured to generate the RF signal 13 and to forward the signal to the feed antenna 12 for transmission towards the reflector 14. The measurement unit 17 can comprise a display for visualizing the received reflections of the RF signals and, in particular, the time difference between said signals.

Here, the time difference between the reception of the respective reflections of the RF signal refers to the difference in time (i.e., the time delay) between the emission of the RF signal and the subsequent reception of the respective reflections from the calibration surfaces 16-1, 16-2 at the different positions in the measurement area 15. For example, if the reflector 14 is misaligned, the time between emission and reception can be shorter for the reflection from one calibration surface 16-2 at one position and longer for the reflection from another calibration surface 16-2 at another position in the measurement area 15 or vice versa.

The RF signal 13 can be a signal between 6 GHz and 90 GHz, preferably between 30 GHz and 40 GHz. The RF signal 13 can be a millimeter wave radar signal.

The measurement area 15 can be a quiet zone of the CATR system 10. Ideally, the quiet zone is an area with a high uniformity of the amplitude and phase of an RF signal generated by the feed antenna 12. The quiet zone is the area where a DUT is placed during normal operation of the CATR system 10. To ensured that signals transmitted from the at least one feed antenna 12 reach the measurement area 15 uniformly, the at least one reflector 14 should be perfectly aligned. The determined and/or visualized time difference between the reflections from the calibration surfaces 16-1, 16-2 can be used to assess and/or to adjust the alignment of the reflector 14. The better the alignment of the reflector 14, the smaller the time difference between the reflections from the calibration surfaces 16-1, 16-2 at the different positions.

The measurement unit 17 can be configured to determine and/or visualize the time difference between the reflections from the calibration surfaces 16-1, 16-2 based on a detected time difference between possible peaks within the received signals. For instance, when arranging the calibration surfaces 16-1, 16-2 simultaneously in the measurement area 15, misalignment of the reflector 14 may result in two peaks within the reflected signal, because a part of the reflected signal has a longer distance to travel. Thereby, a first peak of the reflected RF signal 13 is a reflection from the first calibrating surface 16-1 and a second peak of the reflected RF signal 13 is a reflection by the second calibrating surface 16-2. If such a time difference between two peaks occurs, then the at least one reflector is not aligned perfectly with respect to the at least two calibrating surfaces 16-1, 16-2. An operator can now adjust the at least one reflector so that only one peak is detected or the time difference between two detected peaks is smaller than a threshold value.

The system can further comprise a positioner 18 which is arranged in the measurement chamber 11. The at least two calibration surfaces 16-1, 16-2 can be simultaneously arranged on the positioner 18 as shown in FIG. 1.

The positioner 18 can be made from an RF transparent material, in particular a material which is at least partially transparent for the frequencies of the RF signal 13. In particular, the positioner can be a low scattering mount. For instance, the positioner 18 can also be used for holding a DUT during an operation of the CATR system 10.

As shown in FIG. 1, each of the at least two calibration surfaces 16-1, 16-2 can be surfaces of a different, preferably metallic, object. The respective calibration surfaces 16-1, 16-2 can be made of the same material as the metallic objects or can be formed by a coating of the objects. For instance, the metallic objects can be made of gold plated aluminum, wherein the gold plating forms the calibration surface. The metallic objects can further be made of copper or iron.

The metallic objects can be arranged in and preferably fixed to a number of calibration spots of the positioner 10. Preferably, the metallic objects have a flat base which allows easier arrangement in the calibration spots. Alternatively, the at least two metallic objects comprise a bolt structure or a fixing hole which interacts with a counterpart, e.g. a hole or bolt, of the positioner 18.

For instance, the different metallic objects and, thus, also the calibration surfaces 16-1-16-2 can be connected to each other, e.g., via a connection piece formed by an RF transparent material.

The different metallic objects can be identical with respect to their reflecting surfaces that form the calibration surfaces 16-1, 16-2, such that there is essentially no difference in which calibration spot which object is placed. However, the mounting parts of the different metallic objects can differ from each other.

The metallic objects can be symmetric around at least one axis. The calibration surfaces 16-1, 16-2 can comprise a curved surface and/or straight sides. For instance, the metallic objects can be half-spheres as shown in FIG. 1 such that the calibration surfaces 16-1, 16-2 that are facing the reflector 14 have a spherical shape. The metallic objects can also be cylinders or half-cylinders.

The calibration surfaces 16-1, 16-2 can further be conically shaped. This shape has the advantage that a misalignment of the positioner 18 only minimally affects the reflection of the RF signal 13 back to the reflector 14.

Alternatively to the above, the at least two calibration surfaces 16-1, 16-2 are surfaces of a single, preferably metallic, object. The single metallic object can be placed successively in different calibration spots of the positioner. For each calibration spot, the CATR system 10 can receive the reflection of the RF signal 13 and can thereby determine and/or visualize the time between transmission of the RF signal 13 and reception of the reflection. The time difference between the reflections from different positions in the measurement area 15 can be determined by comparing these measurements for different calibration spots.

The at least two calibration surfaces 16-1, 16-2 can be identical or different surfaces of the single metallic object.

Thus, N >=1 half sphere(s) or cylinder(s) can be placed at different locations inside the measurement area (quiet zone) of the CATR system 10. In principle, also a flat plate could be used as calibration object, however in this case, the alignment of the positioner 18 would also influence the detected time delay (positioner flatness dependency). A cylindrical or spherical shape offers an equal radius to all points along the circumference of the object and is, thus, preferable. As there is equal radius along the cylinder (in one axis) and along all cross-sections of the sphere, inaccuracies of the positioner 18 alignment can be compensated.

Figure 2:
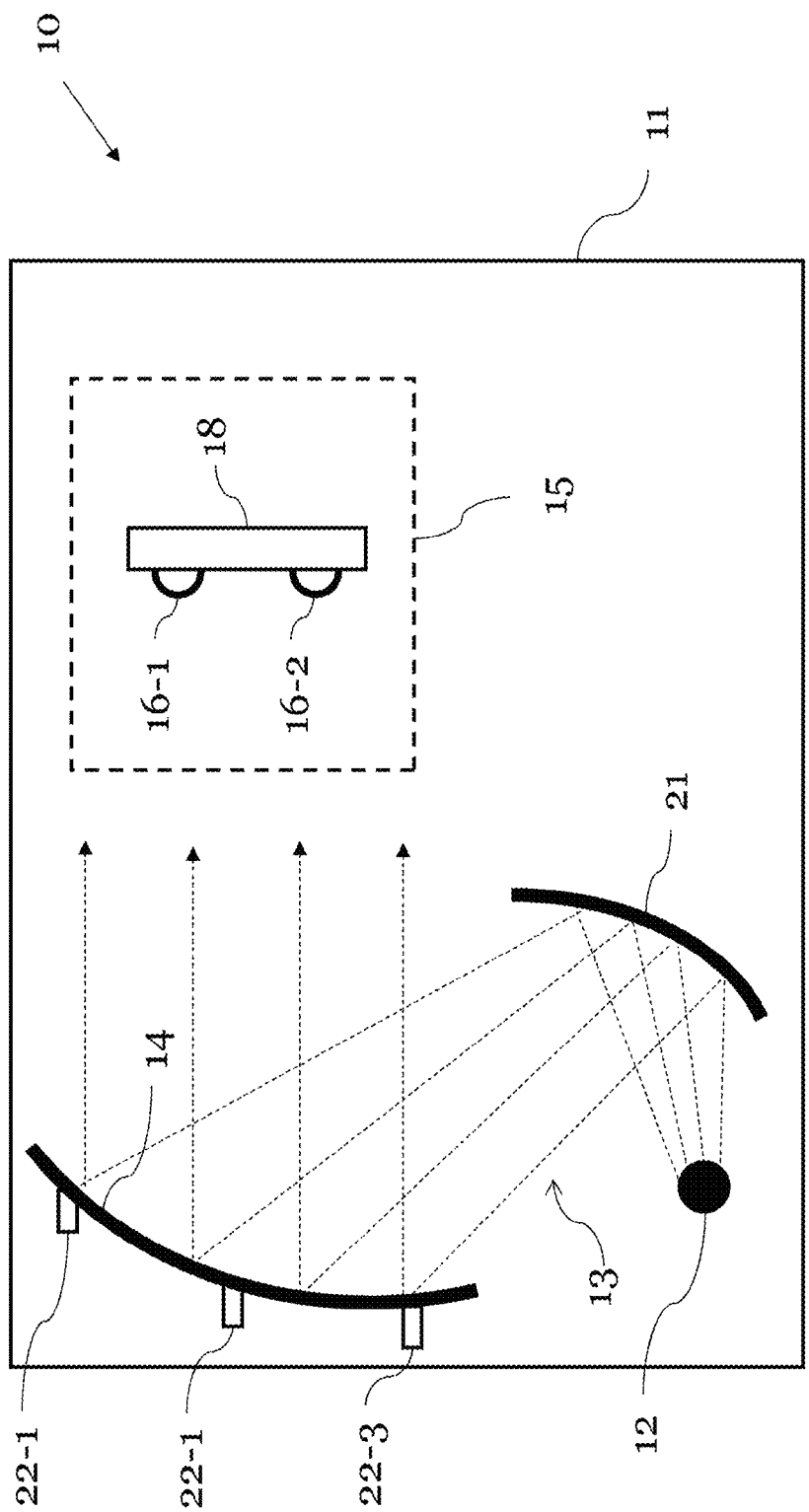
FIG. 2 shows a schematic diagram of a CATR system according to an embodiment.

FIG. 2 shows a schematic diagram of the CATR system 10 according to an embodiment. For the sake of simplicity, the measurement unit 17 of the CATR system 10 is not shown in FIG. 2.

In the embodiment shown in FIG. 2, the reflector 14 comprises three adjustment bolts 22-1 . . . 3. The adjustment bolts 22-1 . . . 3 can be used to adjust an alignment and/or a position of the reflector 14. For instance, an operator can manually adapt the alignment of the reflector 14 relative to the calibration surfaces 16-1, 16-2 via the bolts 22-1 . . . 3. Alternatively or additionally, the CATR system 10 can comprise a calibration unit which is configured to adjust the alignment and/or position of the reflector 14 based on the detected time difference. For instance, this calibration unit can control the adjustment bolts 22-1 . . . 3.

The adjustment bolts 22-1 . . . 3 can be fine adjustment bolts. For instance, two bolts can be configured for aligning a left/right axis and a third bolt can be configured for aligning a front/back axis.

The CATR system 10 in FIG. 2 comprises an optional further reflector 21. This further reflector 21 is arranged between the feed antenna 12 and the reflector 14. The further reflector could also be arranged between the reflector 14 and the measurement area 15. Typically, the positioner 18 faces the reflector which is to be aligned.

Alternatively, the further reflector 21 could be arranged at an angle to the reflector 14 and could be configured to reflect a further RF signal from another feed antenna to the measurement area 15. Preferably, the further reflector 21 is arranged to reflect the RF signal to the measurement area 15 at an angle of 45° relative to the RF signal reflected from the reflector 14. In that case, the positioner 18 which is holding the at least two calibration surfaces 16-1, 16-2 could be rotated such that the RF signal from the further reflector 21 hits the at least two calibration surfaces 16-1, 16-2 directly from the top. Then, the alignment and/or position of the further reflector 21 could be adjusted in the same way, as described above for the alignment/position of the reflector 14.

Figure 3:
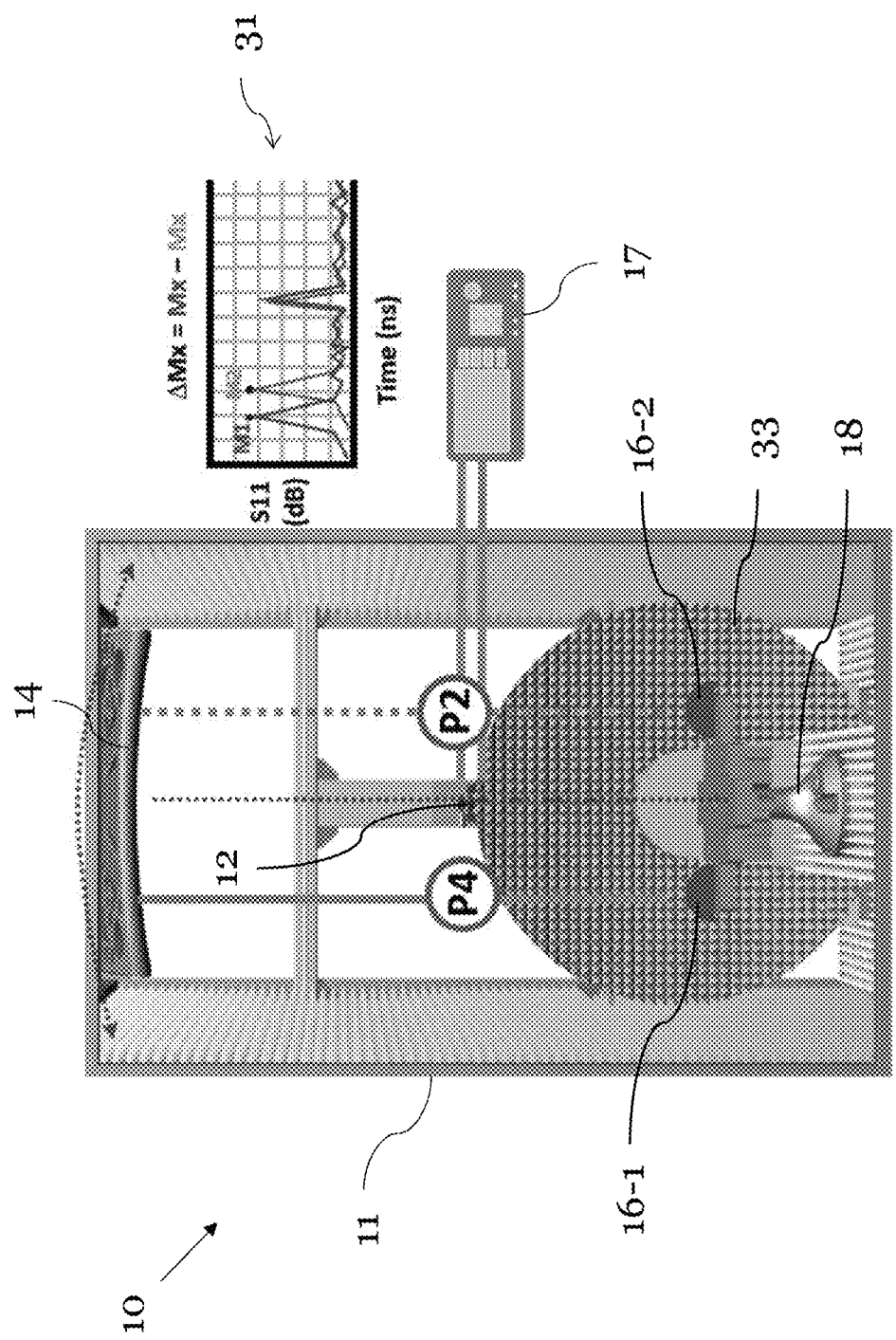
FIG. 3 shows a schematic diagram of a CATR system according to an embodiment.

FIG. 3 shows a schematic diagram of the CATR system 10 according to an embodiment.

The CATR system 10 shown in FIG. 3 comprises a blocker 33 which is arranged between the feed antenna 12 and the positioner 18 in the measurement chamber 11. The blocker 33 can prevent that the feed antenna 12 directly transmits the RF signal 13 in the direction of the measurement area 15.

An adjustment of the alignment and/or position of the reflector 14 of such a CATR system 10 can be performed in two different ways.

According to a first way, a metallic object with at least one calibration surface 16-1, 16-2 is placed in the positioner 18 at a first position P2 and a time-domain reflection is measured, i.e. the time between the transmission of the RF signal and the reception of the reflection from the object is measured. This can result in the detection of at least one signal peak. For instance, one peak is caused from the reflection of the surface on top of the metallic object and the further peaks are caused from reflections from either other parts of the metallic object or from the chamber 11. These secondary effects/peaks can be ignored. Based on this measurement, a time delay (tau2) of the detected peak from t=0 (e.g., transmission of the RF signal from the feed antenna 12) can be determined. In a subsequent step, the metallic object is placed in the positioner 18 at a second position P4 that is symmetric across the center of the measurement area from the first position P2 and the time-domain reflection measurement is repeated to calculate a time delay (tau4) for the object in the second position. Subsequently, the alignment of the reflector 14 can be adjusted and the measurement is repeated until tau2 equals tau4 or the difference between tau2 and tau4 is smaller than a threshold value.

According to a second way, one metallic object with a first calibration surface 16-1 is placed at P2 and a second metallic object with a second calibration surface 16-2 is simultaneously placed at P4. The time-domain reflections from both objects are measured in one continuous measurement. If the time-domain measurement results in more than one peak of equal power, the reflector alignment, in particular tilt, can be adjusted until only one peak of equal or greater power is detected or until the time difference between the peaks is smaller than a threshold value.

Subsequent to the measurements at P2 and P4, the object(s) can be placed at further positions (P1 and P3) and the calibration measurements can be repeated.

In particular, when arranged at P2 and P4, the calibrating surfaces are arranged on a first plane and are symmetrical to each other compared to a center axis through the measurement area 15 (indicated as a dashed line in FIG. 3). The first plane and the central axis are essentially parallel to the propagation direction of the RF signal 13 that is reflected off the reflector 14 towards the measurement area 15. When arranged at P1 and P3, the calibrating surfaces are arranged on a second plane which is perpendicular to the first plane and is also parallel to the central axis. In this way, the time difference can be measured for different axis. For instance, for aligning the reflector 14, different adjustment bolts 22-1 . . . 3 can be tuned depending on where the at least two metallic calibrating surfaces are placed.

FIG. 3 further shows a diagram 31 with the reflected RF signals as received by the measurement unit 17. The reflected RF signals have two main peaks M1 and M2, wherein each of these peaks is caused by a reflection of one of the calibration surfaces 16-1, 16-2. By adjusting the alignment of the reflector 14, the temporal difference between the peaks ΔM can be minimized. The diagram 31 can be displayed in a display of the measurement unit 17. Such time domain measurements, for example, only require 1-2 ports of the measurement unit 17 which can be a VNA.

In contrast, when adjusting the reflector tilt based on phase measurements with a horn antenna, 2-3 ports of the VNA are required. Thereby, for example, phase measurements could be performed with a horn antenna at positions P2 and P4 and the alignment of the reflector 14 could be adjusted until the phase difference is zero. However, these phase measurements can be negatively affected by cable bending as well as the geometry of the positioner (flatness and rotary joint). In contrast, the time-domain measurement above is not influenced by these factors, because the reflections from the calibration surfaces can be separated from secondary reflections.

Figure 4A:
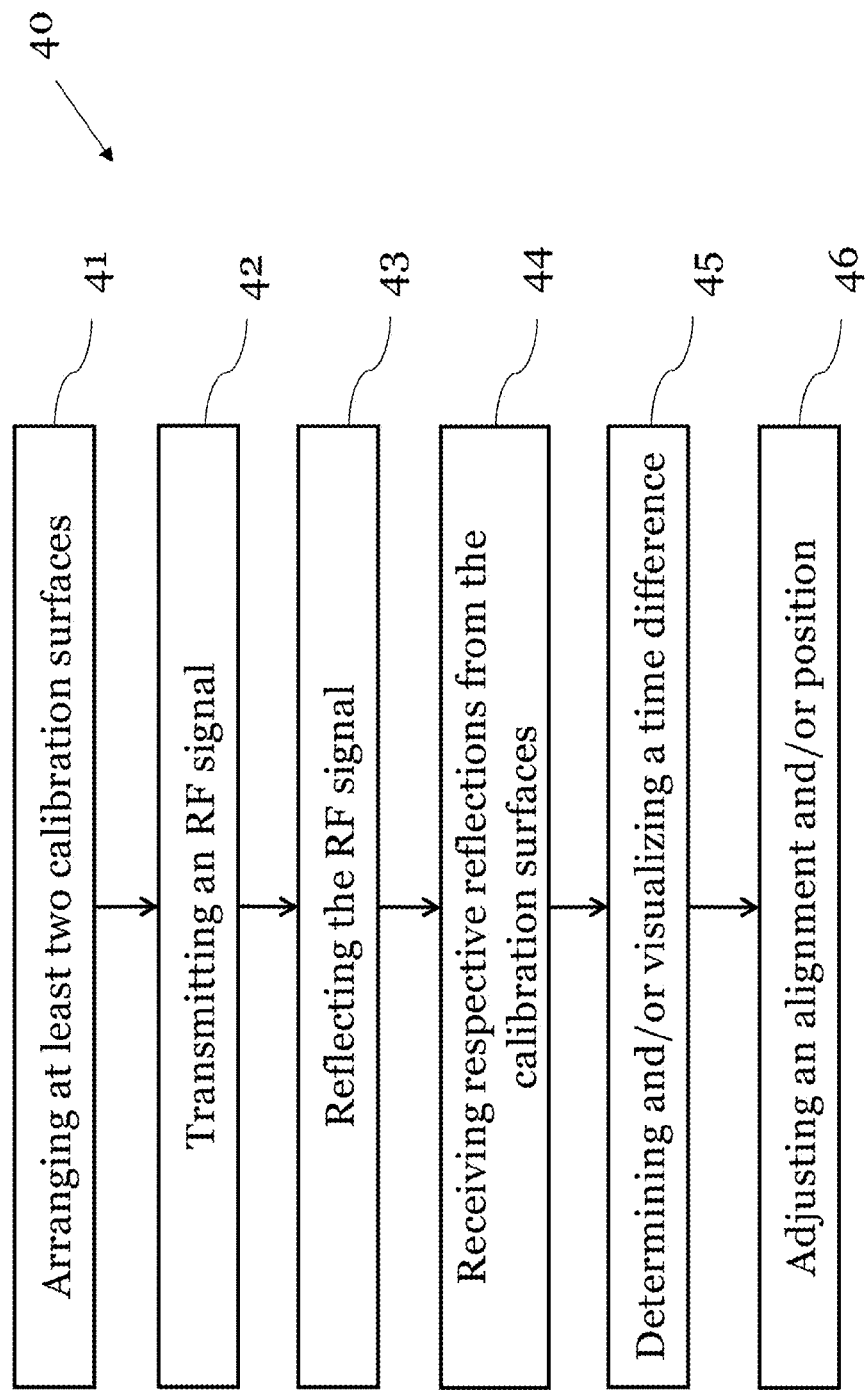
FIGS. 4A and 4B show flow diagrams of a method for calibrating a CATR according to an embodiment.

FIG. 4A shows a flow diagram of a method 40 for calibrating a CATR according to an embodiment.

The method 40 comprises the steps of: arranging 41 at least two preferably metallic calibration surfaces 16-1, 16-2 at two or more positions in a measurement area 15; transmitting 42 an RF signal 15 with a feed antenna 12; reflecting 43 the RF signal 15 towards the measurement area with at least one reflector 14; receiving 44 a respective reflection of the RF signal 13 from the calibration surfaces 16-1, 16-2 at each position in the measurement area 15; determining and/or visualizing 45, in particular measuring, a time difference between the reception of the respective reflections of the RF signal 13; and adjusting 46 an alignment and/or position of the at least one reflector 14 until the time difference is smaller than a threshold value.

For example, the time difference between the respective reflections of the RF signal 13 can be determined and/or visualized based on a temporal difference between signal peaks in the received reflections of the RF signal 13. The alignment and/or position of the reflector 14 can be adjusted, preferably in one plane, until the determined and/or visualized time difference between the two peaks is smaller than a threshold value.

In particular, the two or more positions in the measurement area 15 are arranged in a first plane and can be symmetrical to each other relative to a central axis of the measurement area 15.

The step of receiving 44 the respective reflections can comprise: reflecting the RF signal 13 with each of the at least two metallic calibration surfaces 16-1, 16-2 back to the at least one reflector 14 and, in turn, reflecting the reflected RF signals back to the at least one feed antenna 12 with the at least one reflector 14.

Figure 4B:
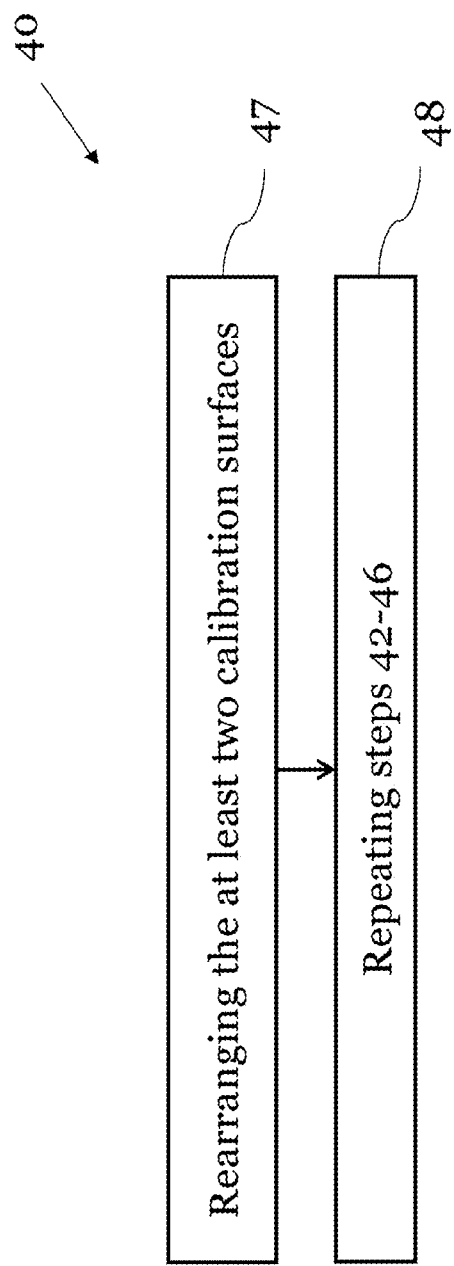

FIG. 4B shows a flow diagram of additional steps of the method 40 according to an embodiment.

The additional steps, which can be carried out subsequently to step 46, comprise: rearranging 47 the at least two calibration surfaces 16-1, 16-2 to two or more further positions in the measurement area 15, wherein two or more further positions are arranged in a second plane that is perpendicular to the first plane, and repeating 48 the steps 42-46 with the at least two calibration surfaces 16-1, 16-2 arranged in the two or more further positions. In this way, the alignment and/or position of the at least one reflector 14 can be adjusted in a second plane.

The method 40 can be used for calibrating a CATR system 10 as shown in any one of the FIGS. 1-3.

All features described above or features shown in the figures can be combined with each other in any advantageous manner within the scope of the disclosure.

The invention claimed is:

1. A compact antenna test range, CATR, system, comprising:
   a measurement chamber,
   at least one feed antenna which is configured to transmit a radio frequency, RF, signal,
   at least one reflector which is arranged to reflect the RF signal towards a measurement area in the measurement chamber, and
   at least two preferably metallic calibration surfaces which can be arranged at two or more positions in the measurement area,
   wherein the calibration surfaces are configured to reflect a respective reflection of the RF signal back to the at least one reflector which is, in turn, configured to reflect the reflections of the RF signal back to the at least one feed antenna, and
   a measurement unit which is configured to receive the respective reflections of the RF signal and to determine and/or visualize a time difference between the reception of the respective reflections of the RF signal.

2. The CATR system of claim 1,
   wherein the measurement unit is configured to detect a signal peak for each reflection of the RF signal from one of the calibration surfaces, and
   wherein the measurement unit is configured to determine the time difference between the reception of the respective reflections of the RF signal based on a temporal difference between the detected signal peaks.

3. The CATR system of claim 1,
   wherein the at least one reflector comprises at least two or at least three adjustment bolts, wherein an alignment and/or a position of the at least one reflector can be adjusted by means of the adjustment bolts.

4. The CATR system of claim 1, further comprising:
   a positioner which is arranged in the measurement chamber, wherein the positioner is made of an RF transparent material, and
   wherein the at least two calibration surfaces can be arranged on the positioner.

5. The CATR system of claim 4,
   wherein the positioner comprises a plurality of calibration spots which are adapted for arranging and preferably fixing the at least two calibration surfaces.

6. The CATR system of claim 5,
   wherein the at least two calibration surfaces are successively arranged at different calibration spots of the positioner.

7. The CATR system of claim 1,
   wherein the at least two calibration surfaces are conically shaped.

8. The CATR system of claim 1,
   wherein the at least two calibration surfaces are identical.

9. The CATR system of claim 1,
   wherein the at least two calibration surfaces are surfaces of a single metallic object.

10. The CATR system of claim 1,
    wherein the at least two calibration surfaces are surfaces of different metallic objects.

11. The CATR system of claim 10,
    wherein each of the metallic objects is symmetric around at least one axis.

12. The CATR system of claim 10,
    wherein each of the metallic objects comprises a flat base.

13. The CATR system of claim 1,
    wherein the two or more positions in the measurement area are arranged in a first plane and are symmetrical to each other relative to a central axis of the measurement area.

14. The CATR system of claim 13,
    wherein the at least two calibration surfaces can be arranged at two or more further positions in the measurement area, wherein the two or more further positions are arranged in a second plane that is perpendicular to the first plane.

15. The CATR system of claim 1,
    wherein the CATR system comprises a further reflector, wherein the further reflector is arranged between the feed antenna and the at least one reflector or between the at least one reflector and the measurement area, and/or
    wherein the further reflector is arranged at an angle to the at least one reflector and is configured to reflect a further RF signal from another feed antenna to the measurement area.

16. A method for calibrating a compact antenna test range, CATR, the method comprising the steps of:
    a) arranging at least two preferably metallic calibration surfaces at two or more positions in a measurement area of the CATR,
    b) transmitting an RF signal with a feed antenna,
    c) reflecting the RF signal towards the measurement area with at least one reflector,
    d) receiving a respective reflection of the RF signal from the calibration surfaces at each position in the measurement area,
    e) determining and/or visualizing a time difference between the reception of the respective reflections of the RF signal, and
    f) adjusting an alignment and/or position of the at least one reflector until the time difference is smaller than a threshold value.

17. The method of claim 16,
wherein the two or more positions in the measurement area are arranged in a first plane, and
wherein the method further comprises the steps of:
g) rearranging the at least two calibration surfaces to two or more further positions in the measurement area, wherein two or more further positions are arranged in a second plane that is perpendicular to the first plane, and
h) repeating the steps b)-f) with the at least two calibration surfaces arranged in the two or more further positions.

\* \* \* \* \*